US007012491B1

(12) United States Patent
Geisberger et al.

(10) Patent No.: US 7,012,491 B1
(45) Date of Patent: Mar. 14, 2006

(54) STORING MECHANICAL POTENTIAL IN A MEMS DEVICE USING A MECHANICALLY MULTI-STABLE MECHANISM

(75) Inventors: Aaron Geisberger, Plano, TX (US); Matthew D. Ellis, Allen, TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 10/238,319

(22) Filed: Sep. 10, 2002

(51) Int. Cl.
     *H01H 51/22*        (2006.01)

(52) U.S. Cl. .......................................... 335/78; 200/181
(58) Field of Classification Search ................. 335/78; 200/181
     See application file for complete search history.

(56) References Cited

U.S. PATENT DOCUMENTS

| 4,383,195 | A  | * | 5/1983  | Kolm et al.        | 310/330   |
|-----------|----|---|---------|--------------------|-----------|
| 5,025,346 | A  | * | 6/1991  | Tang et al.        | 361/283.1 |
| 5,806,152 | A  |   | 9/1998  | Saitou et al.      |           |
| 5,867,302 | A  |   | 2/1999  | Fleming            |           |
| 6,215,081 | B1 | * | 4/2001  | Jensen et al.      | 200/341   |
| 6,239,685 | B1 |   | 5/2001  | Albrecht et al.    |           |
| 6,303,885 | B1 |   | 10/2001 | Hichwa et al.      |           |
| 6,321,654 | B1 | * | 11/2001 | Robinson           | 102/251   |
| 6,561,725 | B1 | * | 5/2003  | Ellis et al.       | 403/326   |
| 6,672,795 | B1 | * | 1/2004  | Ellis et al.       | 403/327   |
| 2001/0010348 | A1 | * | 8/2001 | Bilanin et al.    | 244/215   |
| 2003/0210115 | A1 |   | 11/2003 | Kubby et al.      |           |

OTHER PUBLICATIONS

Qiu, Jin et al., "A Centrally-Clamped Parallel-Beam Bistable MEMS Mechanism", IEEE 2001, pp. 353-356.
Gomm, Troy et al., "In-plane linear displacement bistable microrelay", 2002 IOP Publishing Ltd., UK, pp. 257-264.
Capanu, Mircea et al., "Design, Fabrication, and Testing of a Bistable Electromagnetically Actuated Microvalve", Journal of Microelectromechanical Systems, vol. 9, No. 2, Jun. 2000, pp. 181-188.
Jensen, Brian D. et al., "Design Optimization of a Fully-Compliant Bistable Micro-Mechanism", Proceedings of 2001 ASME Int'l Mech. Eng. Congress and Expo, Nov. 2001, New York, pp. 1-7.
Kruglick, Ezekiel et al., "Bistable MEMS Relays and Contact Characterization", Univ. of California Berkeley Sensors and Actuators Center, 5 pages.
Taher, M. et al., "On a Tunable Bistable MEMS—Theory and Experiment", Journal of Microelectromechanical Systems, vol. 9, No. 2, Jun. 2000, pp. 157-170.
Maekoba, Hideyuki et al., "Self-aligned vertical mirror and V-grooves applied to an optical-switch: modeling and optimization of bi-stable operation by electromagnetic actuation", Sensors and Actuators A 87 (2001) pp. 172-178.

\* cited by examiner

*Primary Examiner*—Lincoln Donovan
*Assistant Examiner*—Bernard Rojas
(74) *Attorney, Agent, or Firm*—Haynes and Boone, LLP

(57) ABSTRACT

A system and method for storing potential energy in a microcomponent is disclosed comprising a multi-stable element having two or more equilibrium states and a stopper to restrict the multi-stable element from entering at least one of the two or more equilibrium states. The pre-charged microcomponent may then preferably be transported to another location and use the stored potential energy to perform some action.

26 Claims, 8 Drawing Sheets

STORING MECHANICAL POTENTIAL IN A MEMS DEVICE USING A MECHANICALLY MULTI-STABLE MECHANISM

GOVERNMENT INTERESTS

The invention was made with Governmental support under Contract 70NANB1H3021 awarded by the National Institute of Standards and Technology (NIST), Grants and Agreements Management Division, 100 Bureau Drive, MAIL STOP 3580, Building 411, Room A143, Gaithersburg, Md. 20899-3580. The Government has certain rights in the invention.

TECHNICAL FIELD

The present application relates in general to microelectromechanical systems (MEMS), and, more specifically, to a system for storing potential energy in a MEMS device using a multi-stable mechanism.

BACKGROUND OF THE INVENTION

MEM devices have many applications for forming any variety of microsensors, microactuators, and other microcomponents. The term "microcomponent" is used herein generically to encompass sub-millimeter electronic/mechanical components, as well as MEM devices, MEM Systems (MEMS) components, and nanoelectromechanical (NEM) devices and systems (NEMS). Microcomponents include such devices as grippers, connectors, relays, and the like. Because of the size of the components and the relative size of the elements that make up these components, it is generally important to have precise positioning, especially in fastening applications. Unless the two devices to be connected or fastened are positioned correctly, the resulting joint may not be properly fit.

Furthermore, in some applications, grippers, connectors, receptacles, and the like, typically consume considerable energy to be "held" in an open and/or closed position. Therefore, in the application of a gripper, for example, electricity may be applied to hold the gripper either open or closed, depending on the design of the gripper. Thus, if the gripper must hold an item for an extended period of time, the electricity must be applied continuously. If, during the holding period, the electricity cannot be maintained, the gripper may let go of the item resulting in possible loss or damage.

It is advantageous to have a microcomponent capable of storing potential energy that can then be used to drive another action of the microcomponent. One current system that stores potential energy in connecting and fastening devices is described in U.S. Pat. No. 5,806,152 issued to Saitou et al., (Saitou). FIG. 1 is a schematic top view of a connecting device configured with a latching mechanism to hold the device in an open position, as described in Saitou. Fastener 10 includes outer latch 101 and inner latch mechanism 102. To facilitate proper operation of fastener 10, outer latch 101 is anchored to the substrate at 104, and inner latch 102 is anchored to the substrate at 105.

In operation, fastener 10 is cocked by depressing fastener 10 at 108. As 108 moves toward the foot of the device, latches 107 will be inserted into holders 106 forming a latched, friction fit. The latching action, thus, stores the potential energy applied in depressing fastener 10 at 108. Fastener 10 is then held in an open position without applied electricity or other continuous energy. As cocked fastener 10 is used to pick up object 103, the top of object 103 engages inner latch 102 which would then cause latches 107 to be removed from holder 106. Fastener 10 would then snap into a locked position with latches 109 clamping into holders 110 to hold object 103 in place. The potential energy stored in the latching process increases the clamping force which has the effect of self-positioning object 103.

The problem with the Saitou device is that it is anchored to the substrate, and thus, not very mobile. Furthermore, the holding mechanism relies on the strength and formation of the latches and latch-holders and the frictional forces between the latches and the latch-holder. Therefore, if a latch is misformed during manufacture or is deformed through an external force, the latch would not typically hold securely and could not store the potential energy in the device. Additionally, the latch portion may also shear off if an excessive amount of stressed is placed on the device.

BRIEF SUMMARY OF THE INVENTION

The present invention is directed to a system and method for storing potential energy in a microcomponent comprising a multi-stable element having two or more equilibrium states and a stopper to restrict the multi-stable element from completely reaching at least one of the two or more equilibrium states. The pre-charged microcomponent may then preferably be transported to another location and use the stored potential energy to perform some action.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Instead of relying on the friction fit latching mechanism from Saitou, one embodiment of the present invention relies on a multi-stable element, such as a bistable device, to supply the energy storing mechanism. A bistable device is generally an element having two low-energy, equilibrium states, such that the device will typically remain in one of the two states unless energy is applied to the device to switch it into the other state. Because of this functionality, bistable devices have been used for switches, relays, and the like.

Figure 1:
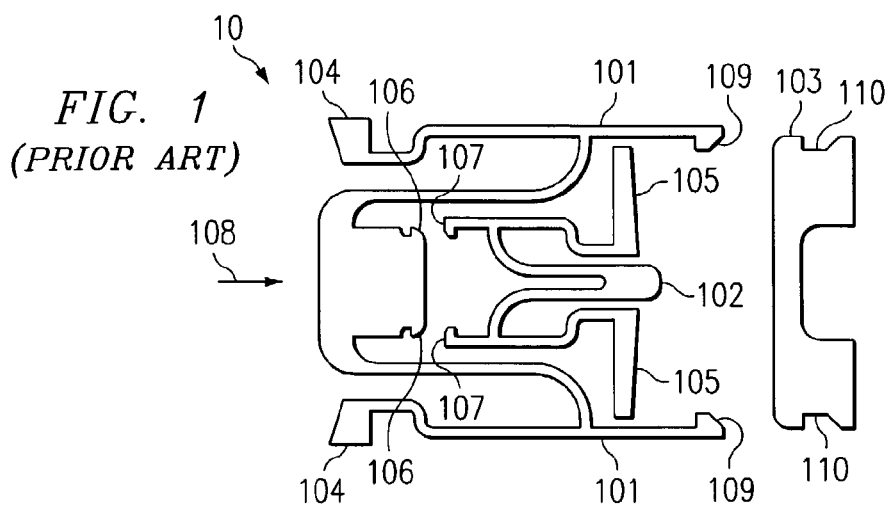
FIG. 1 is a schematic top view of a connecting device configured with a latching mechanism to hold the device in an open position.
Figure 2A:
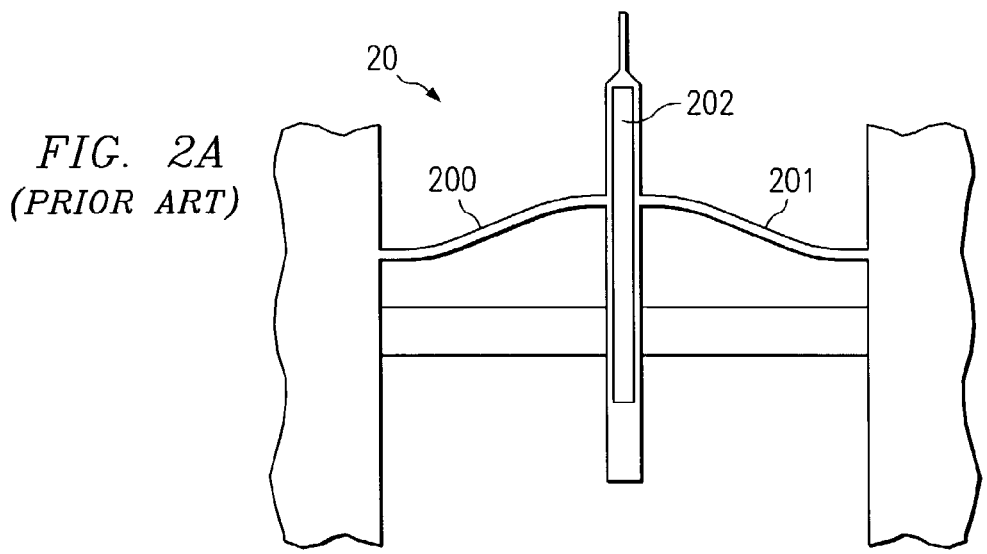
FIG. 2A is a schematic diagram illustrating a first type of bistable device in a first state.
Figure 2B:
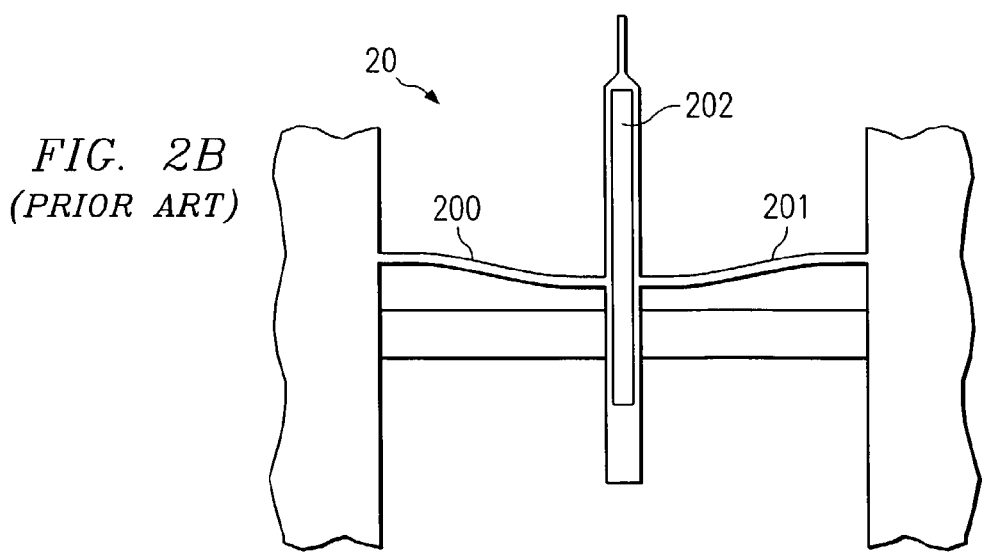
FIG. 2B is a schematic diagram illustrating a first type of bistable device in a second state.

Many different types of bistable devices have been devised for use as such switches, relays, actuators, and the like. One such device is disclosed in U.S. Pat. No. 6,303,885 to Hichwa, et al., (Hichwa). FIG. 2A is a schematic representation of the bistable micro-switch disclosed in Hichwa. The Hichwa-described device 20 consists essentially of spring arms 200 and 201 working in conjunction with center beam 202. As the center beam 202 is pushed toward the second state, the spring arms 200 and 201 build up resistance force until the entire unit is pushed over the snap-through point, at which the switch is tripped to the other state, as shown in FIG. 2B, with center beam 202 held in the second equilibrium position. Spring arms 200 and 201 are in compression due to the spring action. This compression essentially creates the two states necessary for the bistable condition.

Figure 3A:
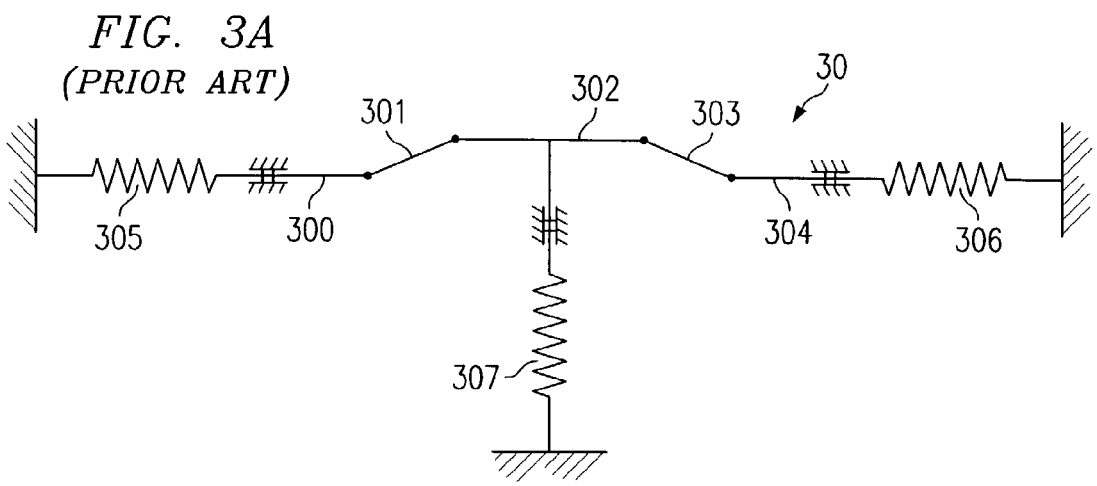
FIG. 3A is a schematic diagram illustrating a second type of bistable device.
Figure 3B:
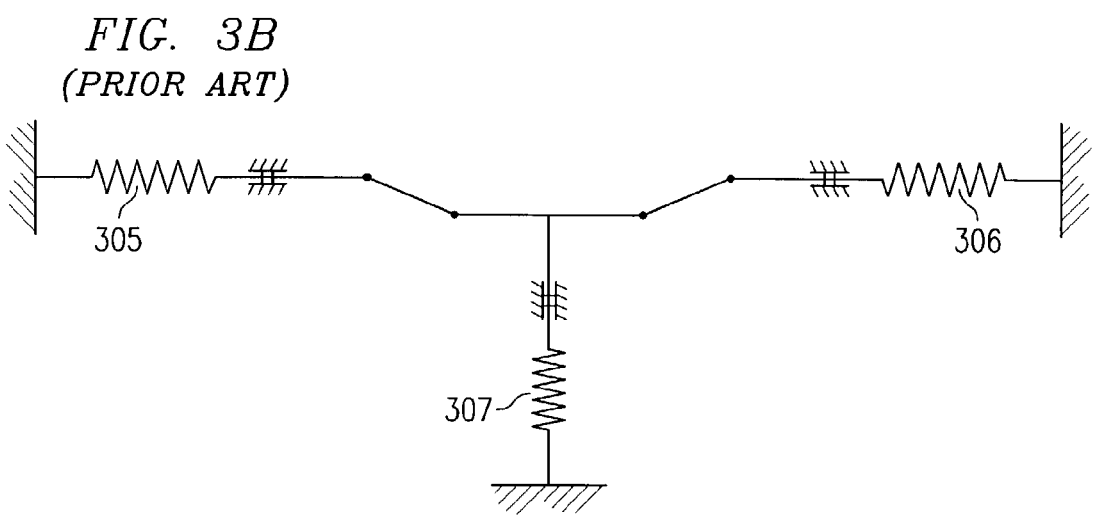
FIG. 3B is a schematic diagram illustrating a second type of bistable device in a second state.

FIG. 3A is a schematic view of another embodiment of a bistable micro-switch also disclosed in Hichwa. The bistable device 30 includes hinged arms 300–304 with springs 305–307 anchoring bistable device 30 to the surrounding substrate. Similarly, in operation, as energy is applied to center unit 302, springs 305–307 compress until reaching the snap-through point, at which time the switch changes to the other equilibrium state, as shown in FIG. 3B. Similarly, springs 305–307 provide the compression force necessary to create the bistable condition.

Figure 4A:
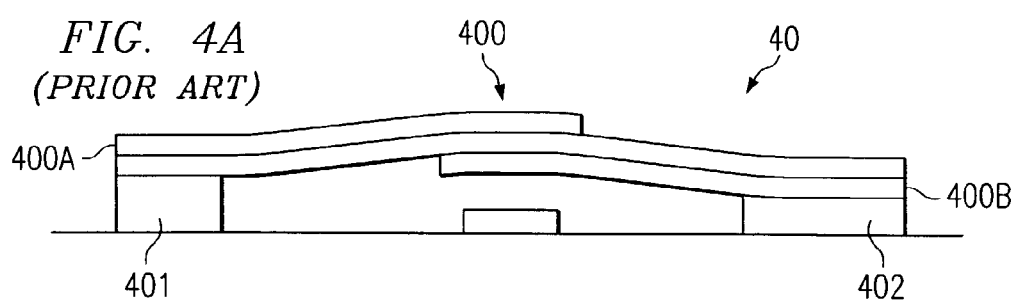
FIG. 4A is a schematic diagram illustrating a third type of bistable device.
Figure 4B:
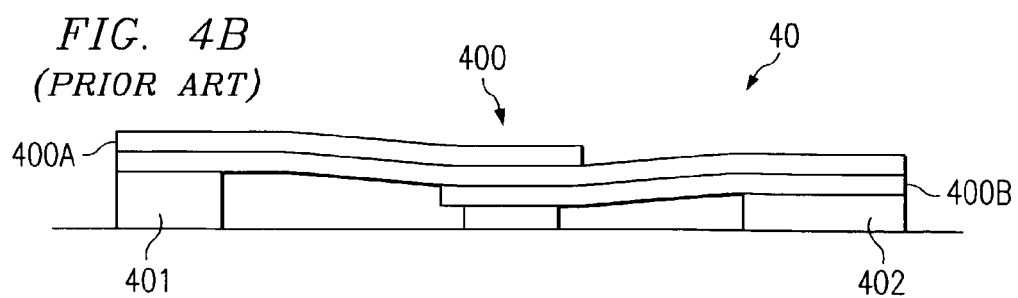
FIG. 4B is a schematic diagram illustrating a third type of bistable device in a second state.

Another type of bistable device is disclosed in U.S. Pat. No. 6,239,685 to Albrecht, et al., (Albrecht). Albrecht discloses a beam consisting of two different materials, having different coefficients of thermal expansion which span an area between two anchor points. FIG. 4A is a schematic diagram illustrating a multi-material bistable device. Bistable device 40 comprises beam 400 spanning between anchor points 401 and 402. The beam is constructed of materials 400A and 400B having different coefficients of thermal expansion. In operation, as thermal energy is applied to material 400A, the bistable device will enter the first stable state. Conversely, when thermal energy is applied to material 400B, the bistable device will enter the second stable state, as shown in FIG. 4B.

Figure 5A:
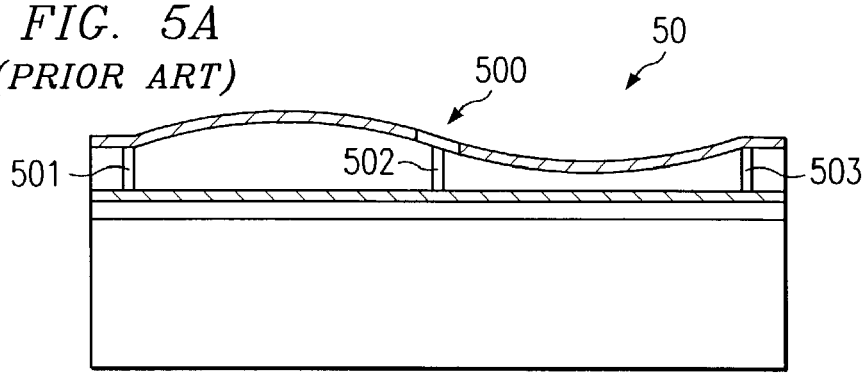
FIG. 5A is a schematic diagram illustrating a fourth type of bistable device.
Figure 5B:
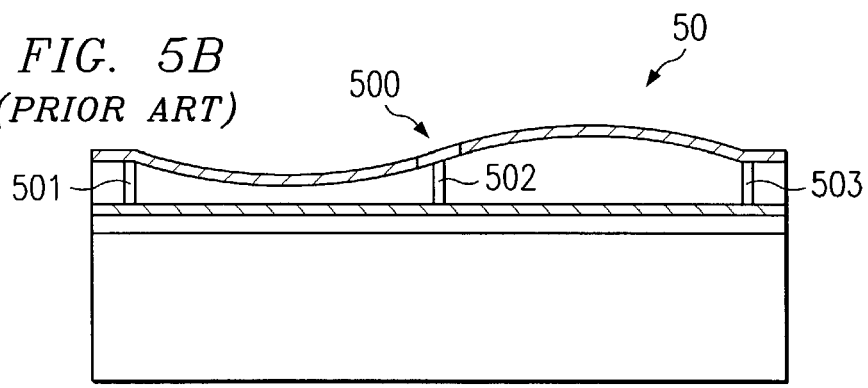
FIG. 5B is a schematic diagram illustrating a fourth type of bistable device in a second state.

Another type of bistable device is disclosed in U.S. Pat. No. 5,867,302 to Fleming (Fleming). Fleming discloses a bistable device comprising a beam anchored by at least three anchors in which the beam forms a curvilinear cross-sectional shape, with the anchor points at the ends and the midpoint. FIG. 5A is a schematic diagram illustrating a bistable device configured in a curvilinear cross-section. Bistable device 50 comprises beam 500, which is stressed under compression while secured at anchors 501–503. The stressing of beam 500 creates the two equilibrium states of the device. By applying electrostatic energy to beam 500, the orientation will change to the second equilibrium state, as shown in FIG. 5B, which is described in Fleming as having mirror-image symmetry.

Figure 6A:
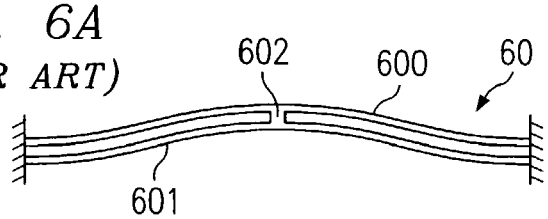
FIG. 6A is a schematic diagram illustrating a fifth type of bistable device.
Figure 6B:
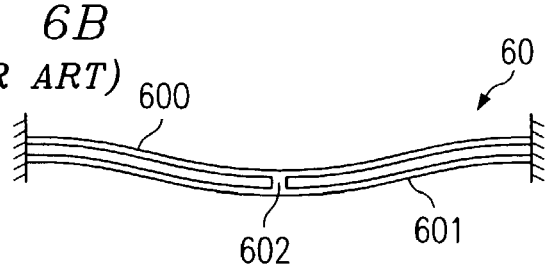
FIG. 6B is a schematic diagram illustrating a fifth type of bistable device in a second state.

Still another type of bistable device is disclosed in the article, A Centrally-Clamped Parallel-Beam Bistable MEMS Mechanism, by Jin Qiu, et al. FIG. 6A is a schematic view of the centrally-clamped parallel-beam bistable device. Bistable device 60 comprises beams 600 and 601 anchored at each end and connected to one another through central connection 602. The different feature of centrally-clamped bistable device 60 is that there are no internal stresses present in beams 600 and/or 601 in the equilibrium state. Thus, centrally-clamped bistable device 60 has its two steady-state positions simply due to its geometry and central connection. As energy is applied to bistable device 60 it deflects and deforms until reaching the snap-through point, at which time device 60 continues to the second equilibrium position, as shown in FIG. 6B, without any further actuation force or energy.

Many other types or variations of the above-described types of bistable devices have been well-documented and used extensively as switches, actuators, relays, and the like. However, each of the above-described variations are anchored to the substrate (i.e., not released into a free-moving device). Additionally each of the above-described devices makes use of both equilibrium states in its operations. In the switch, the device flips from the first steady-state position into the second to actuate and "deactuate" the controlled system. Contacts or relays are often included in such devices to supply the electric switching effects. Through this state-to-state transitioning, energy is applied and expended, but not stored because the energy that is used when the bistable device is deflected up to the snap-through point will be returned by the energy released in moving to the second equilibrium state after snap-through.

Figure 7A:
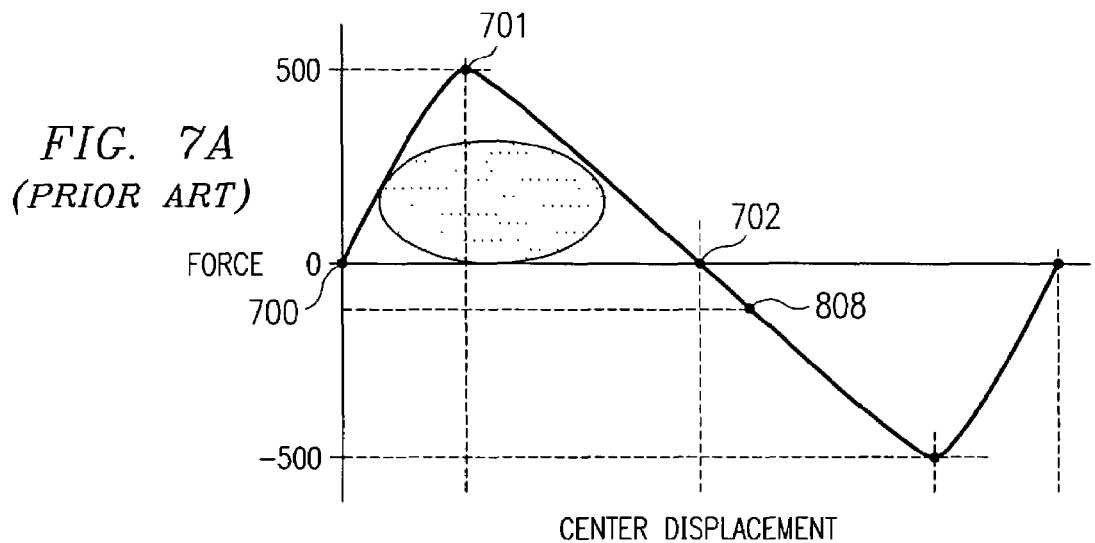
FIG. 7A is a graph illustrating the force necessary to transition a bistable device from one equilibrium state to the other as a function of deflection distance.

Bistable device 60 (FIG. 6A) comprises a centrally-clamped device. FIG. 7A is a graph illustrating the force necessary to transition bistable device 60 from one equilibrium state to the other as a function of deflection distance. At point 700, almost no force is required to begin device 60 moving. However, the necessary force continues to increase until peak force 701 is reached. This is the point in the deflection that requires the strongest amount of force to move device 60. After peak force 701 is reached, less force is typically required to move device 60 towards snap-through point 702. At snap-through point 702, device 60 essentially snaps itself into the second bistable position by releasing any and all of the energy that had been stored or built up in the system prior to snap-through point 702.

It should be noted that the transition force curve, as shown in FIG. 7A, may take many different shapes depending on the specific design of the bistable device. For example, the force displacement curve does not have to be symmetric, nor does the potential energy versus displacement curve need to be symmetric as shown.

It should further be noted that many different types of force may be used to pre-charge or load the multi-stable elements of the present invention. For example, thermal energy, electrostatic energy, magnetic energy, and mechanical energy may be applied to the multi-stable element in order to drive the element toward any one of its multiple, equilibrium states. Additionally, surface tension forces may also be used to pre-charge or load the multi-stable elements.

Figure 7B:
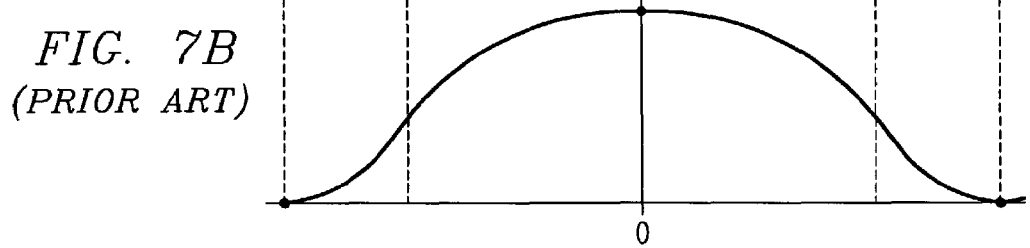
FIG. 7B is a graph illustrating the energy consumed in switching a bistable device between its two states.

FIG. 7B is a graph illustrating the energy consumed in switching a bistable device between its two states. As shown in the graph, the energy slowly increases as the bistable device is deflected closer to snap-through point 702 (FIG. 7A). The energy then decreases until the device enters the second state. As indicated above, depending on the specific design of the bistable device, the graphs illustrated in FIGS. 7A and 7B may take on many different shapes representing different energy displacements and/or energy potential storage characteristics.

Figure 8:
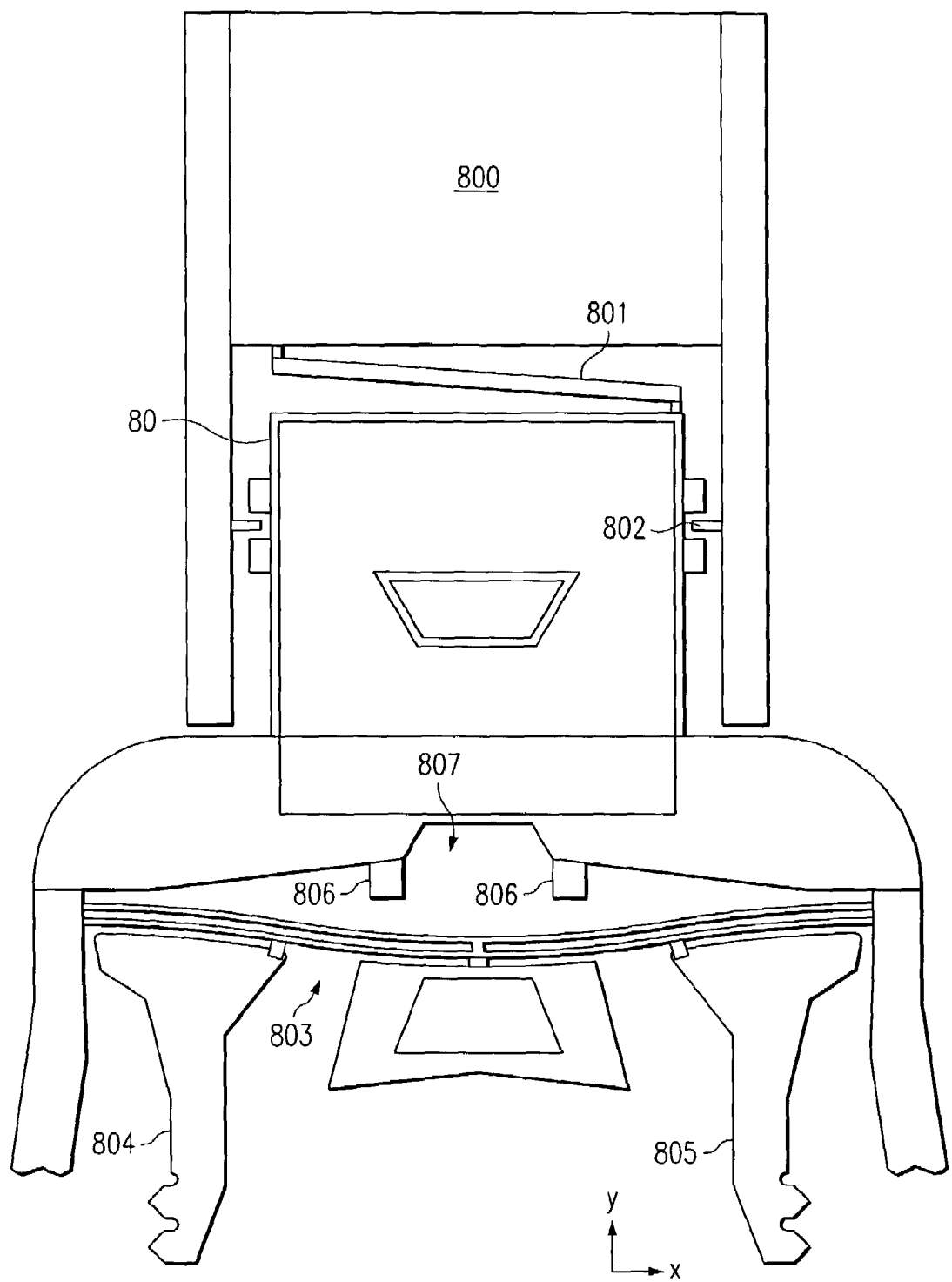
FIG. 8 is a schematic view of an embodiment of a MEMS connector configured according to the teachings of the present invention.

FIG. 8 is a schematic view of an embodiment of a MEMS connector configured according to the teachings of the present invention. MEMS connector 80 is shown released but constrained to housing 800 with tether 801 and mechanical guides 802. MEMS connector 80 preferably comprises bistable element 803 coupled to connector arms 804 and 805. MEMS connector 80 also preferably comprises stoppers 806. In operation, stoppers 806 preferably obstruct or restrict bistable element 803 from switching completely into the second equilibrium state. Thus, because bistable element 803 is not able to completely transition from the first to the second equilibrium state, potential energy has preferably been stored in the system. Furthermore, referring to the graph of FIG. 7A, because bistable element 803 is stopped just after snap-through point 702, relatively little force is preferably required to push bistable element 803 back over snap-through point 702 to release the stored potential energy and close connector arms 804 and 805. This preferably results in an energy barrier for releasing the stored potential energy that is significantly less than the stored energy, thus, creating a device with a lower activation energy than the "latched" devices described in Saitou.

Figure 9:
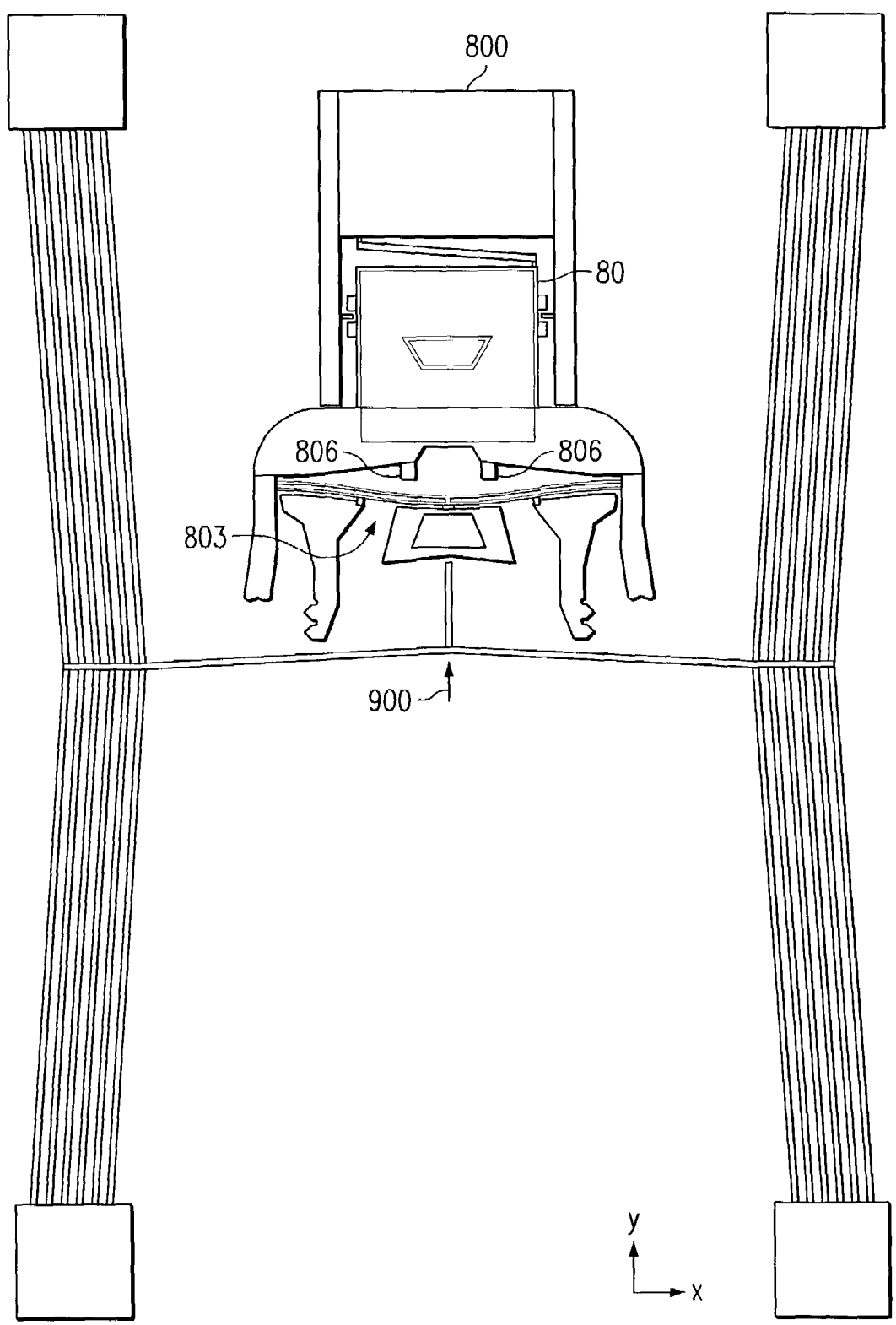
FIG. 9 is a schematic view of one embodiment of a mechanism for pre-loading a MEMS connector configured according to the present invention.

FIG. 9 is a schematic view of one embodiment of a mechanism for pre-loading MEMS connector 80. Fixed housing 800 holds MEMS connector 80 in place while bistable element 803 is transitioned into its higher energy state. Actuators 900, attached to a substrate material, push bistable element 803 against stoppers 806 to pre-load bistable element 803 with its potential energy. Once MEMS connector 80 is loaded with potential energy, it may then preferably be removed from fixed housing 800 by severing tether 801 for application and then transported or moved to another location to perform some kind of function powered by the stored energy.

Figure 10A:
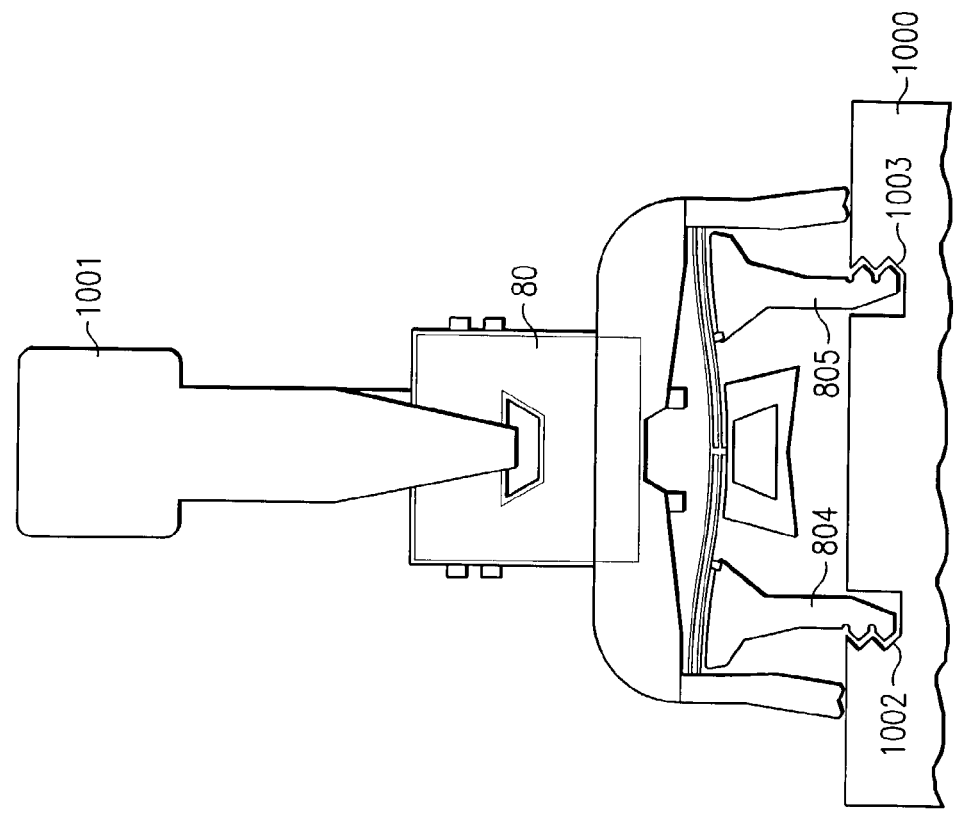
FIG. 10A is schematic view of a receptacle configured to receive a pre-loaded MEMS connector as shown in FIG. 9.
Figure 10B:
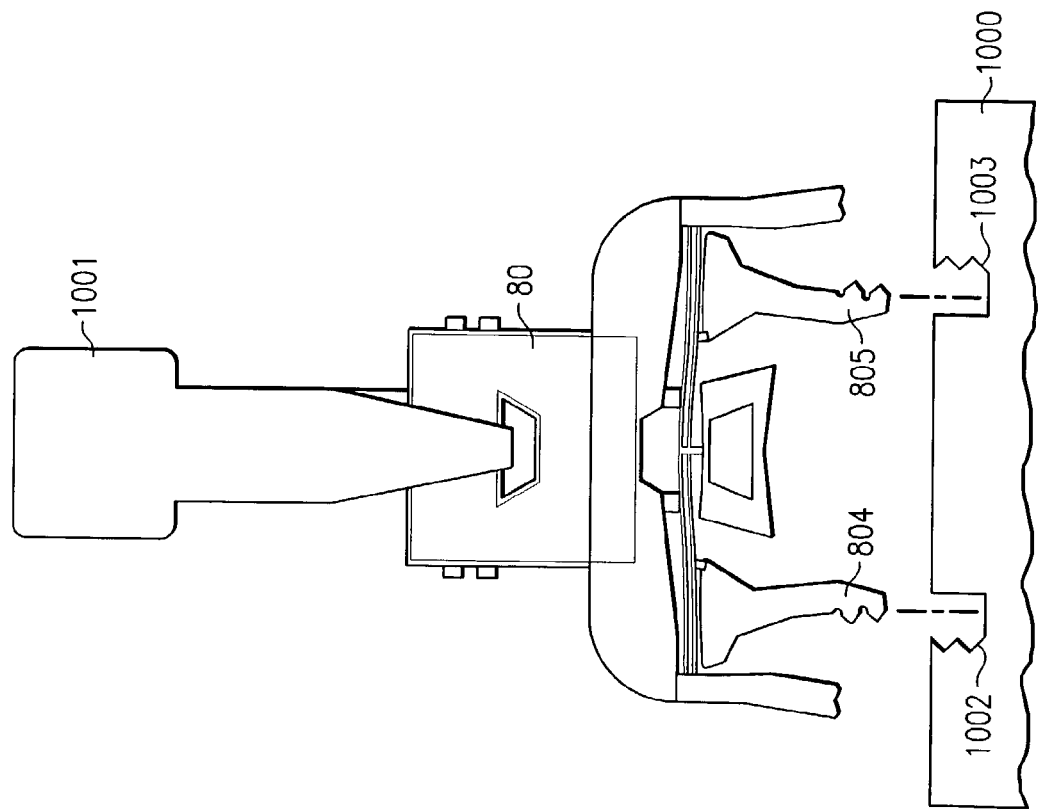
FIG. 10B is a schematic view of the receptacle of FIG. 10A connected to the MEMS connector as shown in FIG. 9.

FIG. 10A is schematic view of a receptacle configured to receive a pre-loaded MEMS connector as shown in FIG. 9. In operation, detethered MEMS connector 80 may preferably be positioned into corresponding receptacle 1000 using micromanipulation means 1001. When MEMS connector 80 has been positioned in receptacle 1000, as shown in FIG. 10B, micromanipulation means 1001 pushes MEMS connector 80 against receptacle 1000, which pushes MEMS connector 80 back over the snap-through point releasing the stored potential energy. By releasing the energy, MEMS connector 80 snaps into place in receptacle 1000 with connector arms 804 and 805 snapping out to fit into corresponding latch receptors 1002 and 1003 (FIG. 10B).

The present invention has many potential uses for pre-loading sub-millimeter devices such as grippers, semi-active receptacles, mechanical connectors, linking apparatuses, and the like. Grippers consume large amounts of energy because most are configured to grip when energy is applied to the gripper. Therefore, to maintain a grip on an object, a continuous energy supply is necessary. The snap-locking feature of the present invention provides optimal use in connectors and receptacles to join or couple devices with a larger force than is required to access the stored potential energy.

Figure 11:
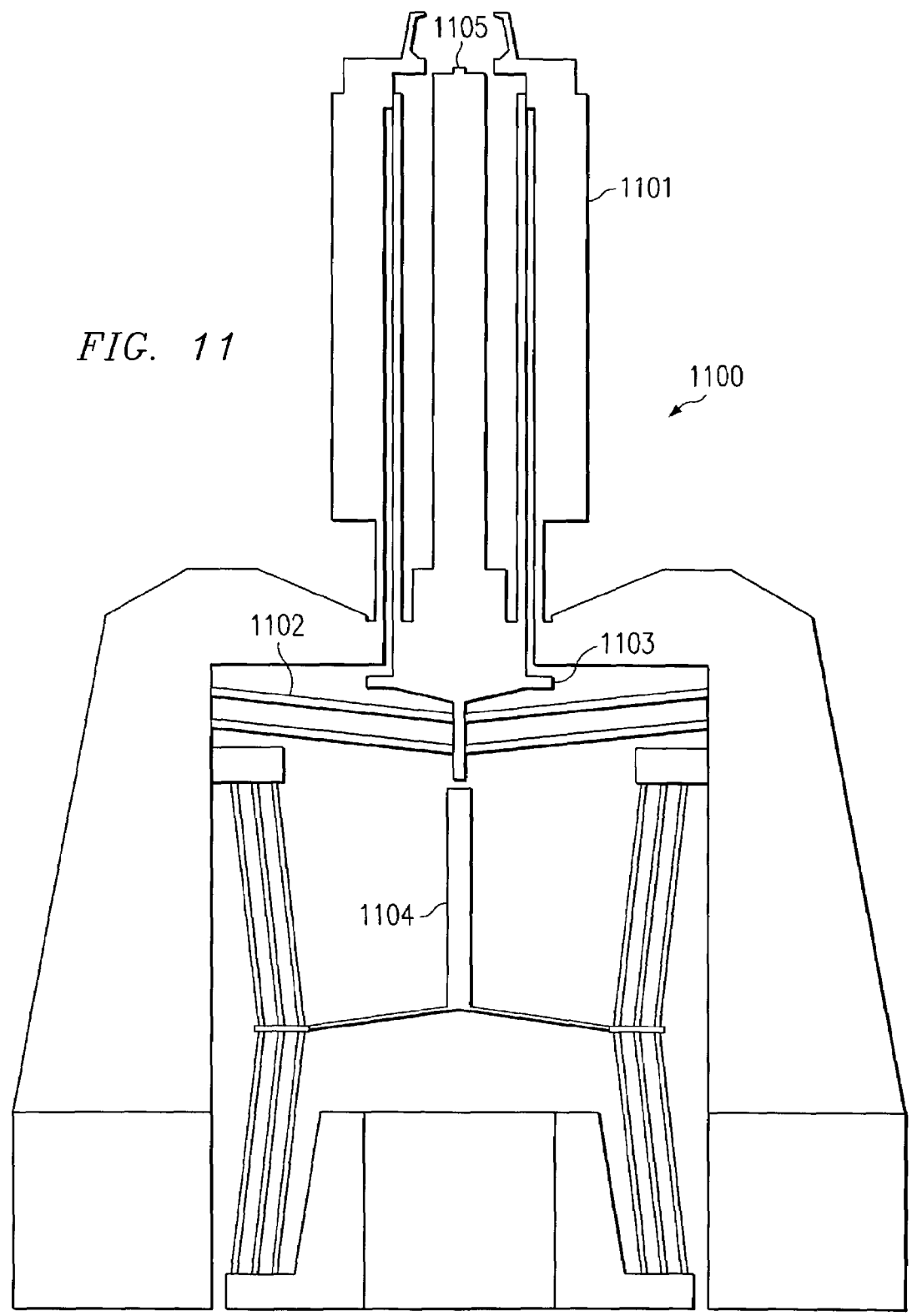
FIG. 11 is a schematic view of a microgripper configured with a bistable element for providing pre-loaded energy.

FIG. 11 is a schematic view of a microgripper configured with a bistable element for providing pre-loaded energy. Gripper unit 1100 comprises gripper arms 1101, bistable mechanical system 1102 with stopper pads 1103 for creating the pre-charged effect on gripper unit 1100. Gripper unit 1100 also includes electrothermal actuator 1104 for manipulating bistable mechanical system 1102 for loading and re-loading the potential energy. In operation, energy is applied at electrothermal actuator 1104 which will push on bistable mechanical system 1102, connected to center beam 1105, to pre-charge bistable mechanical system 1102. As bistable mechanical system 1102 is pre-charged, it pushes on gripper arms 1101, such that gripper arms 1101 open. When an object is to be picked up, it pushes on center beam 1105 which pushes bistable mechanical system 1103 back through the snap-through point and to the first equilibrium state, closing gripper arms 1101 around the object.

Figure 12:
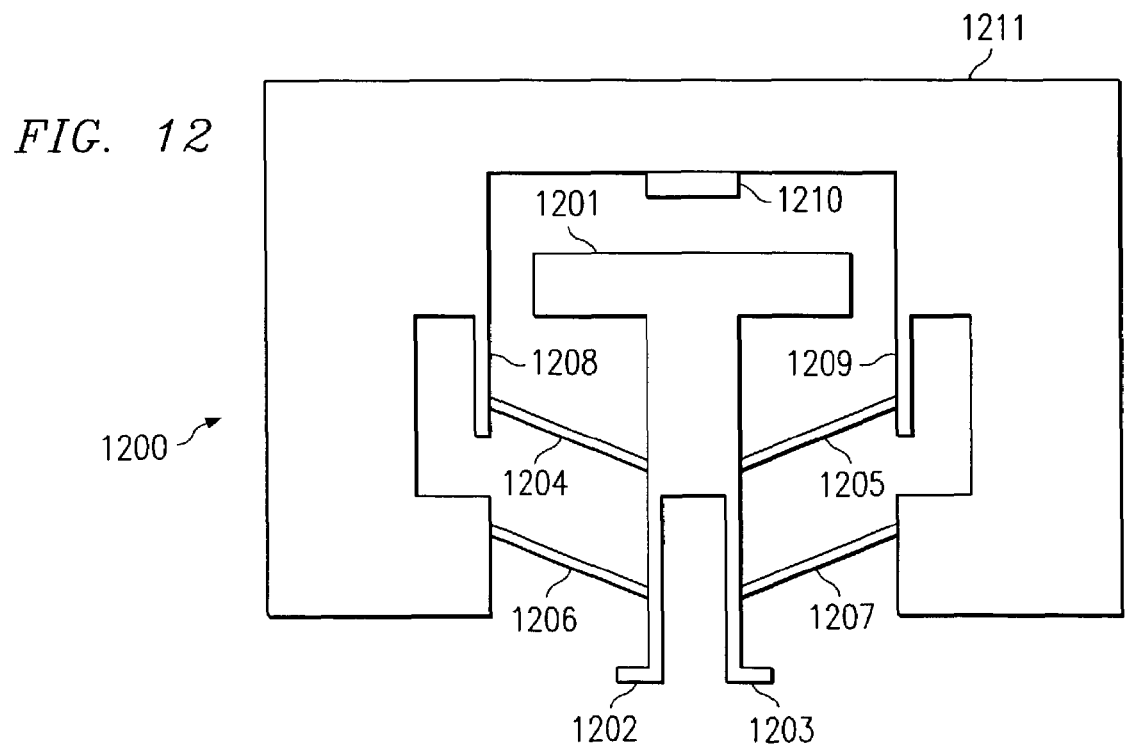
FIG. 12 is a schematic view of a microconnector configured with a bistable element for pre-loading potential energy.

FIG. 12 is a schematic view of a microconnector configured with a bistable element for pre-loading potential energy. Connector 1200 includes center unit 1201 having latch arms 1202 and 1203 for connecting to another object or receptacle. Center unit 1201 is suspended by arms 1204–1207 within casing 1211. Arms 1204 and 1205 are anchored to compliant arms 1208 and 1209 formed in casing 1211. As center unit 1201 is pushed up, compliant arms 1208 and 1209, and latch arms 1202 and 1203 deflect allowing center unit 1201 to transition up toward casing 1211. Stopper 1210 is placed on casing 1211 in such a manner to stop center unit 1201 from fully entering into the second equilibrium state. Thus, after center unit 1201 passes through the snap-through point, stopper 1210 keeps it from releasing all of the energy stored from moving it from the first equilibrium state. In its pre-charged state, latch arms 1202 and 1203 are pinched together in an open position. As release energy is applied to connector 1200, center unit 1201 will return to the first equilibrium state causing latch arms 1202 and 1203 to latch an object.

It should be noted that, while only two types of bistable devices were described in implementation of different embodiments of the present invention, any bistable device may be used to achieve the inventive purpose.

It should further be noted that additional embodiments of the present invention may be implemented using multi-stable devices with three or more possible steady-state, low energy positions. Such embodiments may provide energy for non-binary systems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, comprising:
   a multi-stable element configured to transition toward ones of a plurality of equilibrium states;
   a stopper configured to restrict the multi-stable element from entering at least one of the plurality of equilibrium states; and
   a first microcomponent member operable by the transition of the multi-stable element to engage with a second microcomponent member;
   wherein the first microcomponent member includes an opposing pair of connector arms configured to cooperate to engage the second microcomponent member.

2. The apparatus of claim 1 wherein engagement of the first and second microcomponent members corresponds to one of the plurality of equilibrium states.

3. The apparatus of claim 1 further comprising the second microcomponent member.

4. The apparatus of claim 1 wherein at least one of the first and second microcomponent members is at least a portion of a microcomponent selected from the group consisting of:
   a gripper microcomponent;
   a receptacle microcomponent; and
   a connector microcomponent.

5. The apparatus of claim 1 wherein engagement of the first and second microcomponent members corresponds to one of the plurality of equilibrium states.

6. The apparatus of claim 1 wherein the opposing pair of connector arms is configured to grasp the second microcomponent member.

7. The apparatus of claim 1 wherein the opposing pair of connector arms is configured to grasp the second microcomponent member in response to transition of the multi-stable element to one of the plurality of equilibrium states.

8. The apparatus of claim 1 wherein the opposing pair of connector arms is configured to grasp the second microcomponent member in response to transition of the multi-stable element out of one of the plurality of equilibrium states.

9. The apparatus of claim 1 wherein the microcomponent is not anchored to a substrate.

10. The apparatus of claim 1 wherein at least one of the plurality of equilibrium states is a restricted equilibrium state into which the stopper is configured to restrict the multi-stable element from entering, the apparatus further comprising a pre-charging unit configured to provide charge energy to transition the multi-stable element from one of the plurality of equilibrium states and toward the restricted equilibrium state to at least a snap-through point between the one of the plurality of equilibrium states and the restricted equilibrium state.

11. The apparatus of claim 10 wherein the charge energy provided by the pre-charging unit comprises one of:
    thermal energy;
    electrostatic energy;
    surface tension from drying forces;
    magnetic energy; and
    mechanical energy.

12. The apparatus of claim 10 further comprising a triggering object configured to provide release energy to transition the multi-stable element away from the restricted equilibrium state and toward the one of the plurality of equilibrium states.

13. The apparatus of claim 12 wherein the release energy is less than the charge energy.

14. The apparatus of claim 1 wherein the multi-stable element is a bi-stable element.

15. An apparatus, comprising:
    means for moving an element between first and second low-energy states;
    means for stopping movement of the element toward the second low-energy state prior to the element reaching the second low-energy state; and
    means for coupling with a sub-millimeter object in response to movement of the element toward the first low-energy state;
    wherein the coupling means includes a plurality of arms, wherein ones of the plurality of arms are configured to cooperatively respond to movement of the element between the first and second low-energy states to couple the apparatus and the sub-millimeter object.

16. The apparatus of claim 15 wherein the element moving means includes means for applying energy to the element to move the element between the first and second low-energy states.

17. The apparatus of claim 15 wherein the movement stopping means, by stopping movement of the element toward the second low-energy state prior to the element reaching the second low-energy state, preserves energy applied to the element by the energy applying means.

18. The apparatus of claim 13 further comprising:
    means for releasing the preserved energy; and
    means for providing energy to the element to move the element toward the first low-energy state to at least a snap-through point between the first and second low-energy states.

19. The system of claim 18 wherein energy required to move the element toward the second low-energy state until the element is stopped at a stop point by the movement stopping means is greater than energy required to move the element from the stop point to at least the snap-through point.

20. The apparatus of claim 15 wherein the coupling means includes the element moving means and the movement stopping means.

21. The apparatus of claim 15 wherein the element is an element of a micro-electro-mechanical (MEMS) device.

22. The apparatus of claim 15 wherein the element is an element of a component having at least one sub-millimeter feature, the component selected from the group consisting of:
- a gripper;
- a receptacle; and
- a connector.

23. The apparatus of claim 15 further comprising the sub-millimeter object.

24. An apparatus, comprising:
- a transportable microcomponent including:
  - a first device having first and second low-energy states;
  - an obstructor to prevent the first device from entering the second low-energy state after transporting from the first low-energy state to past a snap-through point, wherein energy is stored in the first device when the first device is loaded against the obstructor;
- a linking apparatus configured to connect the microcomponent to a second device; and
- at least one handle configured to accommodate gripping by a micromechanical manipulator.

25. The apparatus of claim 24 wherein the linking apparatus uses the energy stored in the first device to secure a connection between the microcomponent and the second device.

26. The apparatus of claim 24 wherein at least one of the microcomponent and the second device is selected from the group consisting of:
- a gripper;
- a receptacle; and
- a connector.

* * * * *